(12) United States Patent
Chittipeddi et al.

(10) Patent No.: US 6,230,293 B1
(45) Date of Patent: May 8, 2001

(54) METHOD FOR QUALITY AND RELIABILITY ASSURANCE TESTING OF INTEGRATED CIRCUITS USING DIFFERENTIAL $I_{DDQ}$ SCREENING IN LIEU OF BURN-IN

(75) Inventors: Sailesh Chittipeddi, Allentown; Daryl E. Diehl, Bethlehem; Thomas N. Hofacker, Northampton; Richard J. Jenkins, Allentown, all of PA (US); Mamata Patnaik, Windmere, FL (US); Robert T. Smith, Coopersburg, PA (US); Michael J. Toth, New Ringgold, PA (US); Keelathur N. Vasudevan, Macungie, PA (US); Michael Washko, Barto, PA (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/121,991

(22) Filed: Jul. 24, 1998

(51) Int. Cl.[7] .................................................... G01R 31/28

(52) U.S. Cl. ............................................ 714/724; 324/765
(58) Field of Search ..................................... 714/724, 704; 324/765

(56) References Cited

U.S. PATENT DOCUMENTS

| | | | |
|---|---|---|---|
| 5,742,177 | * | 4/1998 | Kalb, Jr. .............................. 324/765 |
| 5,751,141 | * | 5/1998 | Sachdev et al. ..................... 323/312 |

* cited by examiner

Primary Examiner—Phung M. Chung

(57) ABSTRACT

A method for quality and reliability assurance testing a lot of fabricated ICs comprising the steps of testing the differential $I_{ddq}$ of a sample of ICs at a plurality of different voltages, burning-in a sample of ICs, and then testing the functionality of the sample of ICs. The method of the present invention enables the reliability of an entire lot of ICs to be tested by determining an effective screening voltage for differential $I_{ddq}$ testing of the ICs, thereby eliminating the need both to burn-in and conduct post burn-in testing of all future lots of the ICs. The method of the present invention also enables fabrication facilities and workers to be engaged in other tasks rather than testing of ICs.

25 Claims, 2 Drawing Sheets

METHOD FOR QUALITY AND RELIABILITY ASSURANCE TESTING OF INTEGRATED CIRCUITS USING DIFFERENTIAL $I_{DDQ}$ SCREENING IN LIEU OF BURN-IN

FIELD OF THE INVENTION

The present invention relates to the field of quality and reliability assurance testing of integrated circuits (ICs), and more particularly to a method for testing ICs by measuring the quiescent power supply current ($I_{ddq}$) of the ICs at a plurality of voltages.

BACKGROUND OF THE INVENTION

ICs are widely used today in many different applications such as computers, cellular telephones and consumer electronics. ICs are typically fabricated from disc-shaped wafers of silicon on which large numbers of ICs are formed. One common method of IC fabrication is to deposit various layers of materials on the face of a wafer to form the ICs. The wafers are then cut so that the individual ICs can be separated from one another. The ICs are then packaged and stressed in a burn-in quality assurance test.

Conventional burn-in tests are typically comprised of a pre burn-in test, a burn-in stress, and a post burn-in test. The pre burn-in test, which is a typical post-fabrication test, is performed first by placing a packaged IC in software driven automatic test equipment, such as is fabricated by Helwett-Packard Company of Palo Alto, Calif., Teradyne Inc. of Boston, Mass., and others to test the functionality, i.e. the memory, the digital signal processor, the arithmetic logic, the X and Y registers, and logic states, of the ICs. If the IC passes the pre burn-in test, the IC is then placed in an oven at an elevated temperature for several hours while an accelerated voltage is simultaneously applied to the IC in a predetermined sequence. Thereafter, the IC is again placed in the automatic test equipment for the post burn-in test which is identical to the pre burn-in test. If the IC passes both the pre and post burn-in tests, it can be shipped for use to a customer. If the IC fails either one of the pre or post burn-in tests, then the IC is deemed defective and is discarded.

As part of the aforementioned pre and post burn-in tests of the IC, an $I_{ddq}$ measurement is taken at a single predetermined voltage. FIG. 1 shows a plot of $I_{ddq}$ versus voltage for conventional burn-in testing of packaged ICs in which the $I_{ddq}$ measurement is made at one voltage. The plot shows a dark rectangle denoting a range of acceptable $I_{ddq}$ measurement. If the $I_{ddq}$ measured for a particular IC falls within this range then the IC is deemed to have passed this test. If, however, the $I_{ddq}$ measured for a particular IC exceeds this range, then the unit is deem to have failed this test and is discarded.

Although conventional burn-in testing is effective in identifying ICs which are likely to fail once they are in actual use, the process suffers from several drawbacks. First, the process takes a long time to perform and uses production capacity that could otherwise be used for fabricating ICs, thereby increasing the cost of the ICs. Second, conventional burn-in stressing typically fails to test ICs at voltages sufficiently high enough to identify those ICs having defects such as filament shorts and/or leaks between analog and digital blocks. In fact, conventional burn-in stressing cannot be performed at the voltages required to detect such defects because simultaneously subjecting an IC to the combination of the high temperatures at which the burn-in is performed and the high voltages required to detect such defects will irreparably damage the functionality of the ICs.

Accordingly, there exists a need for a method for quality and reliability assurance testing of fabricated ICs which overcomes the foregoing drawbacks. It is therefore an object of the present invention to provide a method for testing packaged ICs that is performed much more quickly and thus less expensively than conventional burn-in testing, and that also enables ICs having physical defects such as filament shorts and/or leaks to be identified and discarded.

SUMMARY OF THE INVENTION

A method for quality and reliability assurance testing of fabricated ICs comprising the step of screening a lot of ICs by measuring the $I_{ddq}$ of each IC in the lot at a plurality of different voltages to ensure functionality. By such testing, the method of the present invention can accurately determine the quality and reliability of the entire lot of ICs without having to bum-in each IC in the lot.

DETAILED DESCRIPTION OF THE DRAWINGS

The following detailed description relates to a preferred embodiment of a method for quality and reliability assurance testing of ICs according to the present invention in which $I_{ddq}$ measurements are made for ICs at a plurality of voltages using automated test equipment. The value of the change in the $I_{ddq}$ measured at the different voltages determines whether the ICs are acceptable for use, or are instead likely to fail and should therefore be discarded. This differential $I_{ddq}$ measurement, denoted as $\alpha I_{ddq}$ and defined by the mathematical equation $\Delta I_{ddq}$ ($I_{ddq}$ at $V_2$)–($I_{ddq}$ at $V_1$), where $V_1$ is the nominal operating voltage of the IC being tested and $V_2$ is the effective screening voltage for the IC, and where $|V_2|>|V_1|$ and $|V_2|<BV$, i.e., the breakdown voltage of the device being tested. The present invention eliminates the need to perform conventional burn-in stressing and post burn-in testing of ICs.

In order to use the method of the present invention as a substitute for conventional burn-in stressing, the effective screening voltage $V_2$ must be known for the ICs being tested. The value of $V_2$ for a particular IC is determined the first time the particular IC is tested using the present invention by correlating the $\Delta I_{ddq}$ measurement denoting IC failure with the burn-in measurement denoting IC failure. The value of $V_2$ will be different for different types of ICs, and can even be different for the same type of IC used in different applications. Consequently, to establish this correlation and thus determine the value of $V_2$ for a particular type of IC, a lot comprised of such ICs has to be tested using both the $\Delta I_{ddq}$ method of the present invention and conventional burn-in stressing.

Figure 2:
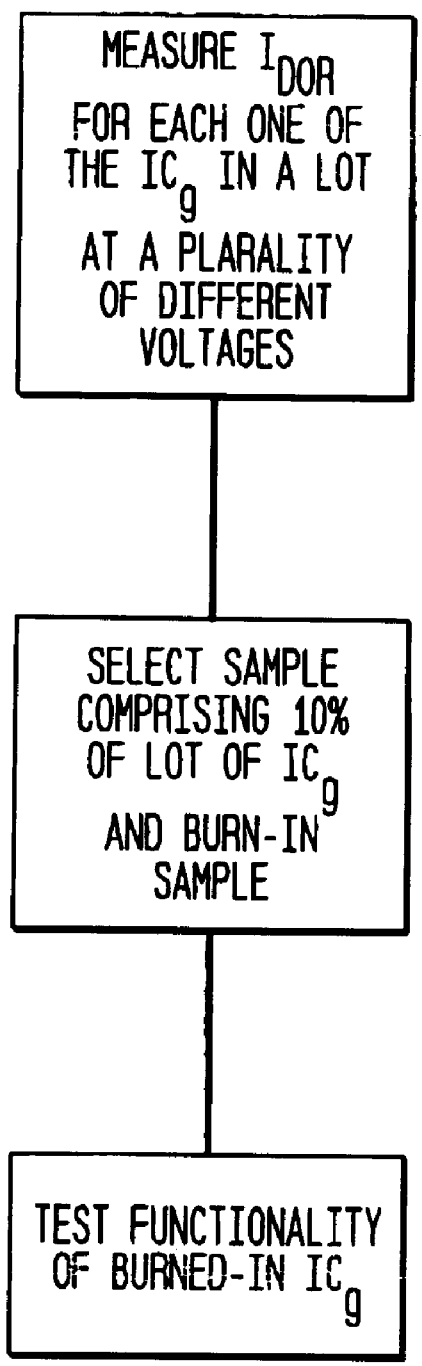
FIG. 2 shows a flow chart of an exemplary embodiment of the method of differential $I_{ddq}$ testing of packaged ICs according to the present invention in which the $I_{ddq}$ measurements are made at a plurality of voltages.

As shown in flowchart form in FIG. 2, the method of the present invention operates as follows. At step 10, a small representative sample of ICs from a single lot, e.g. less than 10%, are tested using conventional post-fabrication burn-in testing, and $\Delta I_{ddq}$ measurements are made at both $V_1$ and $V_2$. Those ICs identified in the $\Delta I_{ddq}$ distribution as being defective, i.e. outliers, are labeled as such. At step 11, the sample of ICs are then stressed in a conventional burn-in. Thereafter at step 12, the burned-in sample of ICs are tested for functionality and the failing devices identified.

If the ICs identified as failures after the post burn-in test are the same ICs identified as outliers in the pre burn-in $\Delta I_{ddq}$ testing, then the value of $V_2$ at which the $\Delta I_{ddq}$ test was performed is an effective screening voltage for the type of IC tested. It may be necessary to test the ICs at several voltages in order to correctly identify $V_2$. Once an effective value has been established for $V_2$ for a particular type of IC, the quality and reliability of all future lots of such ICs can be tested by using the $\Delta I_{ddq}$ method of the present invention, thereby eliminating the need for the conventional burn-in stressing and post burn-in testing of such ICs.

It may also be necessary to test several lots of ICs to determine $V_2$ for a particular type of IC. If 1% or less of the sample of ICs tested are identified both before and after burn-in as outliers, then the remaining ICs from the lot are deemed acceptable for use and can be shipped to a customer. Once an effective value has been established for $V_2$, the shipping criterion for future lots of the ICs will be determined solely by the pre burn-in testing performed using the $\Delta I_{ddq}$ method of the present invention. The aforementioned percentages are provided for purposes of example only and can differ depending upon the type of device being tested and its intended use.

The method of the present invention will increase production capacity which would otherwise be dedicated to burn-in and post burn-in testing of the ICs by making it available for other production tasks. Similarly, it will enable workers to be employed at tasks other than burning-in and performing post burn-in testing of ICs. Consequently, since less time will then be spent testing and burning-in the packaged ICs, the overall cost of fabricating such devices will be reduced. The method of the present invention can be easily included as an additional step in the normal pre burn-in testing of fabricated ICs since the test takes only a fraction of a second to perform and is performed using the same automatic test equipment used for the pre burn-in tests.

Figure 1:
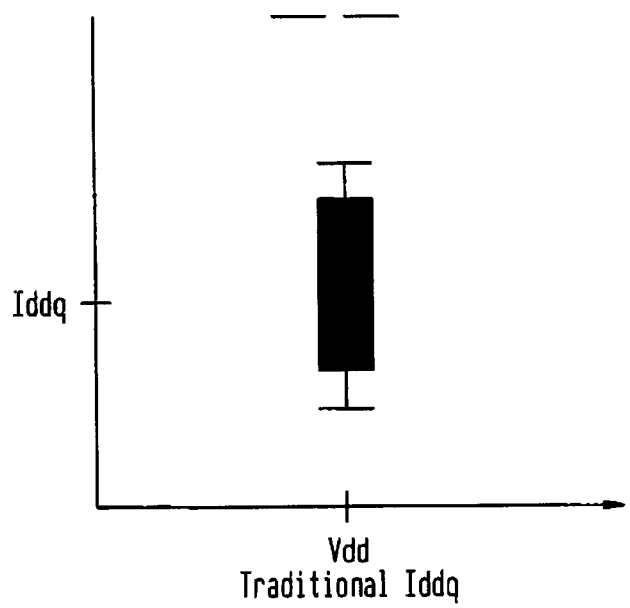
FIG. 1 shows a plot of $I_{ddq}$ versus voltage for conventional burn-in testing of packaged ICs in which the $I_{ddq}$ measurement is made at one voltage.
Figure 3:
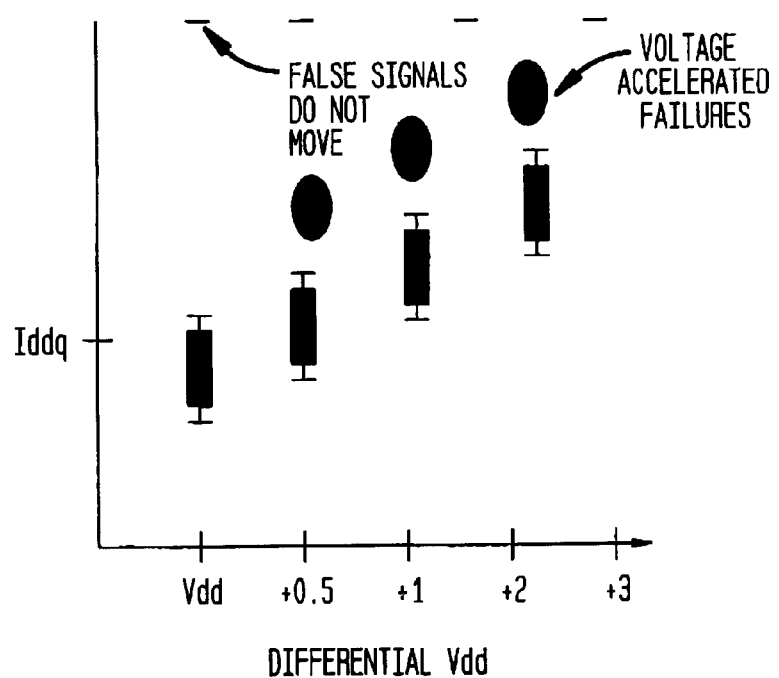
FIG. 3 shows a plot of $I_{ddq}$ versus differential voltage for an exemplary embodiment of the method of differential $I_{ddq}$ testing of packaged ICs according to the present invention in which the $I_{ddq}$ measurements are made at a plurality of voltages.

Referring to FIG. 3 there is shown a plot of $I_{ddq}$ versus voltage for an exemplary embodiment of the method of differential $I_{ddq}$ testing of packaged ICs according to the resent invention in which the $I_{ddq}$ measurements are made at a plurality of voltages. If an IC is found to have an $I_{ddq}$ reading at a voltage in excess of a predetermined range of acceptable $I_{ddq}$ measurements, as denoted in FIG. 3 by the dark ovals, then the unit is deemed defective and is discarded. If, however, the measurements fall within the predetermined range of acceptable $I_{ddq}$ measurements, as denoted in FIG. 3 by the dark rectangles, then the IC is deemed to have passed the test and can be shipped to a customer.

As can be seen in FIG. 3, as the voltage applied to the IC increases, the corresponding range of acceptable $I_{ddq}$ measurements also increases. The method of the present invention can be employed for testing most ICs. Compared to the conventional method of measuring $I_{ddq}$ at a single voltage, the method of measuring $I_{ddq}$ at a plurality of different voltages according to the present invention enhances the ability to detect the potentially defective ICs denoted in FIG. 3 by the dark ovals.

Numerous modifications to and alternative embodiments of the present invention will be apparent to those skilled in the art in view of the foregoing description. Accordingly, this description is to be construed as illustrative only and is for the purpose of teaching those skilled in the art the best mode of carrying out the invention. Details of the structure may be varied substantially without departing from the spirit of the invention and the exclusive use of all modifications which come within the scope of the appended claims is reserved.

What is claimed is:

1. A method for quality and reliability assurance testing of integrated circuits (ICs), comprising the steps of:

measuring the quiescent current $I_{ddq}$ of a sample of ICs from a lot of ICs at two different voltages;

determining the differential quiescent current $\Delta I_{ddq}$ of the ICs by subtracting the value of the quiescent current measured at the first voltage from the value of the quiescent current measured at the second voltage;

identifying those sample ICs having differential quiescent current $\Delta I_{ddq}$ readings falling outside of a first predetermined range of acceptable measurement as potentially defective ICs;

burning-in each one of the sample ICs;

testing the functionality of the burned-in sample of ICs; and identifying those sample ICs having post burn-in functionality readings falling outside of a second predetermined range of acceptable measurement as defective ICs, wherein if the ICs identified as defective by the differential quiescent current measurements are the same ICs identified as defective by the post burn-in functionality testing, then the second voltage is an effective screening voltage for the entire lot of ICs.

2. The method according to claim 1, wherein once the effective screening voltage is known for the lot of ICs, the quality and reliability of all future lots of the same type of ICs can be tested solely by measuring the differential quiescent current $\Delta I_{ddq}$ of all ICs from each future lot at the first and second voltages, thereby eliminating the need to perform conventional burn-in stressing and post burn-in testing of the future lots of the ICs.

3. The method according to claim 1, wherein the first voltage is the nominal operating voltage of the ICs and the second voltage is the effective screening voltage of the ICs.

4. The method according to claim 3, wherein the effective screening voltage is greater than the nominal operating voltage.

5. The method according to claim 3, wherein the effective screening voltage is less than the breakdown voltage of the ICs.

6. The method according to claim 1, wherein the quiescent current $I_{ddq}$ is measured using automated test equipment.

7. The method according to claim 6, wherein measuring the quiescent current $I_{ddq}$ typically takes less then one second.

8. The method according to claim 1, wherein each one of the lot of ICs is deemed acceptable for use if both a majority of the differential quiescent current readings fall within the first predetermined range of acceptable measurement and if a majority of the post burn-in functionality measurements fall within the second predetermined range of acceptable measurement.

9. The method according to claim 1, wherein the functionality of the burned-in sample of ICs is measured using automated test equipment.

10. The method according to claim 9, wherein measuring the functionality of the burned-in sample of ICs typically takes less then one second.

11. The method according to claim 1, wherein the sample of ICs constitutes no more than 10% of the lot of integrated circuits.

12. The method according to claim 1, wherein an IC having a filament short can be identified and discarded as a defective device.

13. The method according to claim 1, wherein an IC having a current leak can be identified and discarded as a defective device.

14. The method according to claim 1, wherein the effective screening voltage is different for each different type of IC.

15. A method for quality assurance testing a plurality of integrated circuits (ICs), comprising the steps of:

applying a first voltage to a sample of ICs from a lot of ICs and measuring a first resulting quiescent current $I_{ddq}$ for the sample ICs;

applying a second voltage to the sample ICs and measuring a second resulting quiescent current $I_{ddq}$ for the sample ICs;

determining the differential quiescent current $\Delta I_{ddq}$ of the sample ICs by subtracting the value of the first resulting quiescent current $I_{ddq}$ from the value of the second resulting quiescent current $I_{ddq}$;

identifying those sample ICs having differential quiescent current $\Delta I_{ddq}$ readings falling outside of a first predetermined range of acceptable measurement as potentially defective ICs;

burning-in each one of the sample ICs; and identifying those sample ICs having post burn-in functionality readings falling outside of a second predetermined range of acceptable measurement as defective ICs, wherein if the ICs identified as defective by the differential quiescent current $\Delta I_{ddq}$ measurements are the same ICs identified as defective by the post burn-in functionality testing, then the second voltage is an effective screening voltage for the entire lot of ICs.

16. The method according to claim 15, wherein once the effective screening voltage is known for the lot of ICs, the quality and reliability of all future lots of the same type of ICs can be tested solely by measuring the differential quiescent current $\Delta I_{ddq}$ of all ICs from each future lot at the first and second voltages, thereby eliminating the need to perform conventional burn-in stressing and post burn-in testing of the future lots of the ICs.

17. The method according to claim 15, wherein the first voltage is the nominal operating voltage of the ICs and the second voltage is the effective screening voltage of the ICs.

18. The method according to claim 17, wherein the effective screening voltage is greater than the nominal operating voltage.

19. The method according to claim 17, wherein the effective screening voltage is less than the breakdown voltage of the ICs.

20. The method according to claim 15, wherein the first and second resulting quiescent current $I_{ddq}$ is measured using automated test equipment.

21. The method according to claim 20, wherein measuring the first and second resulting quiescent current $I_{ddq}$ typically takes less then one second.

22. The method according to claim 15, wherein the entire lot of ICs is acceptable for use if both a majority of the differential quiescent current $\Delta I_{ddq}$ readings fall within the first predetermined range of acceptable measurement and if a majority of the post burn-in functionality measurements fall within the second predetermined range of acceptable measurement.

23. The method according to claim 15, wherein the functionality of the burned-in sample of ICs is measured using automated test equipment.

24. The method according to claim 23, wherein measuring the functionality of the burned-in sample of ICs typically takes less then one second.

25. The method according to claim 15, wherein the sample of ICs constitutes 10% or fewer of the lot of ICs.

* * * * *